United States Patent [19]
Burghardt et al.

[11] Patent Number: 5,805,756
[45] Date of Patent: Sep. 8, 1998

[54] SUBRACK WITH ROUTING MODULES

[75] Inventors: Hartmut Burghardt, Holzkirchen; Hans-Günther Schreck; Ulrich Gruhler, both of München, all of Germany

[73] Assignee: Siemens Aktiengesellschaft, Munich, Germany

[21] Appl. No.: 765,306

[22] PCT Filed: Jun. 26, 1995

[86] PCT No.: PCT/DE95/00823

§ 371 Date: Dec. 30, 1996

§ 102(e) Date: Dec. 30, 1996

[87] PCT Pub. No.: WO96/01437

PCT Pub. Date: Jan. 18, 1996

[30] Foreign Application Priority Data

Jul. 6, 1994 [DE] Germany .......................... 44 23 735.9

[51] Int. Cl.[6] ................................................. G02B 6/36
[52] U.S. Cl. ............................................................ 385/134
[58] Field of Search ..................................... 385/134, 135

[56] References Cited

U.S. PATENT DOCUMENTS

| 5,090,792 | 2/1992 | Koht et al. ................................ 385/32 |
| 5,204,929 | 4/1993 | Machall et al. ......................... 385/135 |
| 5,448,675 | 9/1995 | Leon et al. .............................. 385/135 |

FOREIGN PATENT DOCUMENTS

| 0 511 779 A3 | 4/1992 | European Pat. Off. . |
| 0 494 759 A1 | 7/1992 | European Pat. Off. . |
| 0 604 050 A1 | 6/1994 | European Pat. Off. . |
| 2 681 755 | 3/1993 | France . |

*Primary Examiner*—John Ngo
*Attorney, Agent, or Firm*—Hill & Simpson

[57] ABSTRACT

A subrack has in addition to conventional modules a special routing module. The modules are detachably connected to the routing module via mutually identical bundles of optical fibers and multiple-plug connectors. Devices located outside the subrack are connected to the routing module. The assignment of the connections between the modules themselves, on the one hand, and between the modules and devices located outside the subrack, on the other hand, is carried out on the routing module.

26 Claims, 1 Drawing Sheet

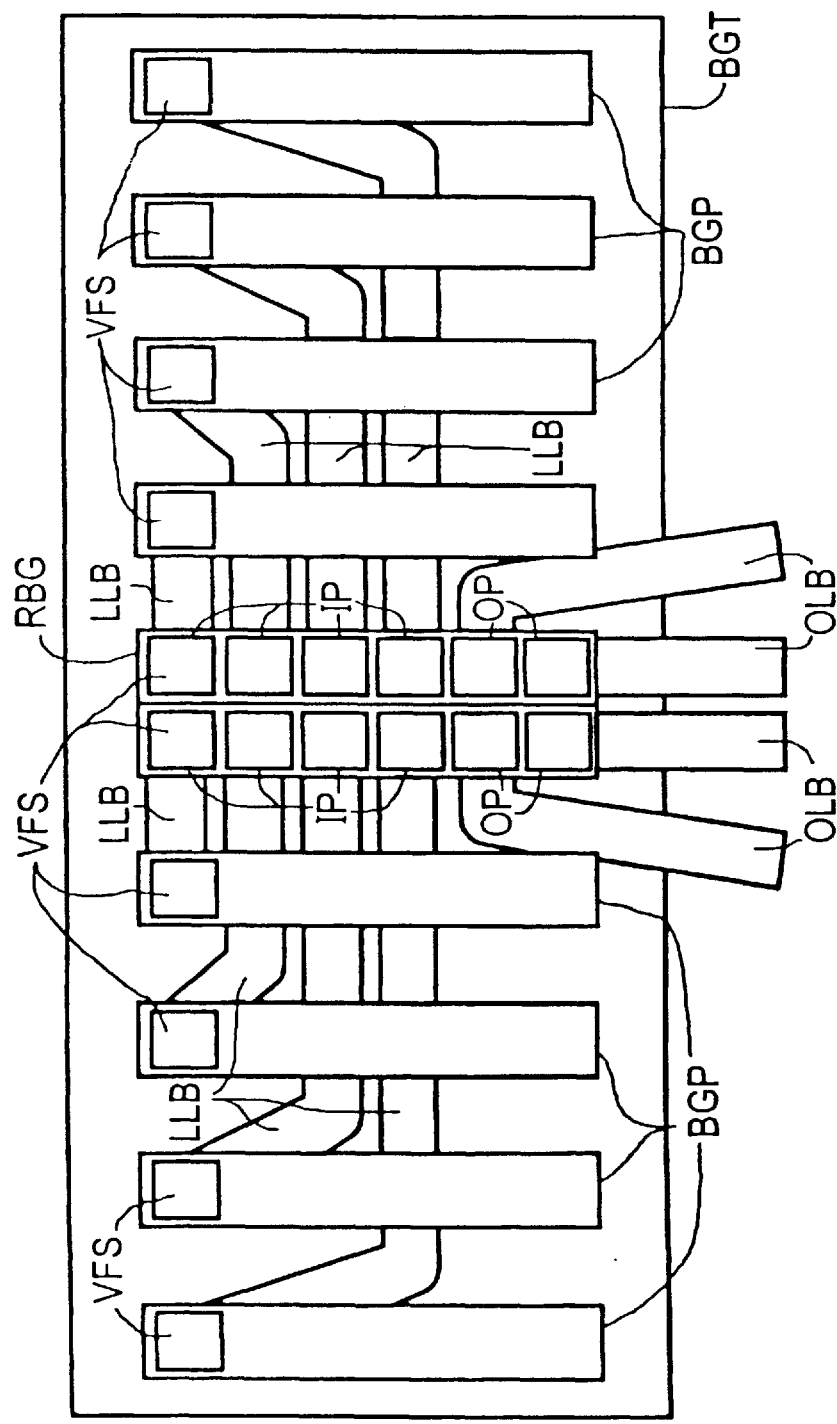

SUBRACK WITH ROUTING MODULES

BACKGROUND OF THE INVENTION

1. Field of the Invention

The subject matter of the invention relates to a subrack for accommodating modules, in which the module subrack has a number of modules each module is detachably connected to another module via an optical fiber and a multiple-plug connector.

2. Description of Prior Art

A module subrack having the features specified is disclosed by EP 0511779.

In a subrack, a plurality of modules are combined to form a mechanically stable unit. Modules which have components receiving or transmitting optical signals must be connected to other modules via optical fibers transporting optical signals. In a case where the connections are made by individual optical fibers, it is found that the production cost is high, for subracks having a different connection structure it being necessary for this structure to be taken into account and, in addition, there being a constant risk of transpositions. In a case where the wiring is carried out conventionally using bundles of optical fibers, it is disadvantageously found that the ends of the individual optical fibers must, in general, be fed to different modules, with the result that the bundle of optical fibers has to be separated with a great deal of effort.

In the case of the subrack disclosed by EP 0511779, the optical output element of each module is connected to all the input elements of the other modules. This concept requires selection on the individual modules of the information intended for them.

The application is based on the problem of indicating a particular configuration for the connections between the modules of a subrack which is largely standardized, simple and can be produced free of errors, and in addition allows feeding only of the information which is intended for the relevant module.

SUMMARY OF THE INVENTION

In the case of the subrack mentioned at the beginning, the problem is solved in that the subrack has a routing module which is common to all the modules, each module is detachably connected to the routing module via a bundle of optical fibers and a multiple-plug connector, the routing module is designed in such a way that an assignment of connections is provided between the individual optical fibers of the bundles of optical fibers connected to the routing module.

The subject matter of the application accomplishes simple connectability of a module of the subrack in a single operation, whilst excluding transpositions. Uniform connecting lines can be provided for different subracks for the connections between the modules and the routing module, the assignment of the individual wave-guides being provided solely by the routing module. By means of exchanging the pluggably arranged routing module for a routing module having a different assignment of the individual connections, a simple capability is provided for changing the assignment of the connections of the modules of a subrack. The subject matter of the application therefore accomplishes a standardization of the connections between modules for subracks having is different connecting functions, whereby the subrack can be prefabricated to a very large extent. The optical signals which are fed to the subrack and are forwarded by the subrack are fundamentally passed via two stages, that is to say via the routing module and the relevant module, with the result that the dynamic requirements of the input stage of the receiver of the optical signals are reduced in comparison with arrangements in which the optical signals are passed partly via only one stage and partly via two stages.

In accordance with the present invention, a module subrack assembly is provided that comprises a subrack that accommodates at least one routing module in addition to one or more conventional modules. Each conventional module is connected to an input port of the routing module by a linking optical fiber bundle. Each linking fiber optical bundle includes two ends, both of which are attached to multiple-plug connectors. One multiple plug connector is attached to the conventional module and the other multiple-plug connector is attached to an input port of the routing module.

The routing module further includes one or more output ports which, in turn, accommodate a multiple-plug connector that is attached to an output optical fiber bundle. The routing module provides the connection between an individual optical fiber of the linking bundle to an individual optical fiber of the output bundle. This "assignment" of one fiber extending from a conventional module to one fiber of the output bundle (which, in turn, is connected to a component remote from the subrack) is provided by the routing module. Hence, if the assignments or connections between individual fibers of the linking bundles that are extending from the conventional modules is to be changed, the entire system does not need to be disassembled. Instead, the routing module can be replaced with a new routing module incorporating the desired assignments.

The present invention also provides an improved method of connecting optical signals from one optical fiber bundle or one module to an output optical fiber bundle or an output module. The method comprises the steps of providing a subrack, attaching at least one routing module to the subrack and attaching at least one conventional module to the subrack. The conventional module and routing module are linked by a linking optical fiber bundle as discussed above. An output fiber optical bundle is attached to an output port of the routing module and a component or alternative module disposed remote from the subrack. The assignment of individual optical fibers in the linking bundle to individual optical fibers in the output bundle is provided by the routing module. To change the assignments, the entire system need not be disassembled. Instead, the routing module simply needs to be replaced with a new routing module with the appropriate or desired assignments.

BRIEF DESCRIPTION OF THE DRAWING

The invention will now be described in more detail as an exemplary embodiment to an extent necessary for understanding with reference to a figure.

FIG. 1 is a schematic representation of the subrack according to the invention.

DETAILED DESCRIPTION OF THE PREFFERED EMBODIMENTS

FIG. 1 reveals the outline of a subrack BGT, known per se, which is able to accommodate a number, in particular a plurality, of modules at subrack locations BGP provided therefor. The modules receive signals via optical fibers or forward signals via optical fibers. In the context which is of interest here, the signals are assumed to be processed in any desired manner on the modules. Furthermore, according to the invention the subrack accommodates a routing module RGB. Each module is detachably connected to the routing module via a multiple-plug connector VFS and a bundle of optical fibers. In this arrangement, a bundle of optical fibers, which is also called a fiber array or a fiber ribbon, is assumed to be terminated by a commercially available plug connector which is able to effect a simultaneous connection or isolation of a plurality of waveguides. The bundles of optical fibers and multiple-plug connectors which connect the modules to the routing module preferably have a mutually identical construction. As a result of constructional measures, it may be ensured that, in the course of a procedure to connect the two cooperating parts of a multiple-plug connector, such as for example plug and coupling or socket, the individual waveguides of a bundle of optical fibers can be connected to the corresponding waveguides only in the assigned sense.

In summary, FIG. 1 illustrates the use of a subrack BGT that accommodates a plurality of respective or conventional modules BGP and one routing module RBG. In the embodiment illustrated in FIG. 1, each conventional module BGP includes one multiple-plug connector VFS and the routing module RBG includes a plurality of multiple-plug connectors VFS. Each conventional module BGP is linked or connected to the routing module RBG by a linking optical fiber bundle LLB that extends between a multiple-plug connector VFS of a conventional module BGP to a multiple-plug connector VFS of the routing module RBG. It will be noted that the routing module RBG includes a plurality of input ports IP as well as a plurality of output ports OP. The linking optical fiber bundles LLB are connected to the input ports IP of the remote module RBG while the output ports OP connect the remote module RBG to a device or component (not shown) disposed at a remote location from the subrack BGT by way of the output optical fiber bundles shown at OLB.

In the case of one embodiment, the bundle of optical fibers belonging to one module is firmly connected to the module on the module side and is terminated on the side of the routing module by a multiple-plug connector. In this arrangement, the multiple-plug connector is assumed to be provided on the side of the bundle of optical fibers by a plug and on the side of the routing module by a coupling cooperating with the plug or by a socket fastened directly on the routing module.

In the case of another embodiment, the bundles of optical fibers leading to the individual modules are firmly connected to the routing module on the side of the routing module and are terminated on the module side in each case by a multiple-plug connector. In this arrangement, the multiple-plug connector is assumed to be provided on the side of the bundle of optical fibers by a plug and on the module side by a coupling cooperating with the plug or by a socket fastened directly on the module.

In the case of a preferred embodiment, the individual bundles of optical fibers are terminated at both their ends with mutually identical multiple-plug connectors. In this arrangement, the multiple-plug connectors are assumed to be provided on the side of a bundle of optical fibers by plugs and on the side of the module or of the routing module by in each case a coupling cooperating with the plug or by a socket fastened directly on the module or the routing module. This measure accomplishes the effect that mutually identical connecting lines can be used between the individual modules and the routing module.

In a further refinement, the part of a multiple plug connection terminating a bundle of optical fibers, for example the plug, is fixed in relation to its position with the subrack. This measure effects a connection or isolation of a module to or from the associated bundle of optical fibers when the module is being inserted into or withdrawn from the subrack.

The routing module is preferably arranged at a central position inside the subrack. If mutually identical, standardized bundles of optical fibers are provided for a subrack, it is in this case advantageously found that the length to be provided of the bundles of optical fibers reaches a minimum.

In addition to the bundles of optical fibers connected to the modules of the same subrack, the routing module is connected to bundles of optical fibers which receive or transmit signals from or to devices located outside the subrack under consideration. These devices can in turn themselves be provided by subracks.

The routing module is therefore connected, via a plurality of respective multiple-plug connectors and bundles of optical fibers, both to modules of the same subrack and to devices outside the subrack under consideration. The multiple-plug connectors are preferably of mutually identical construction. The bundles of optical fibers preferably have the same number of wave-guides as one another.

The routing module has the function of assigning the connections between the individual waveguides of the bundles of optical fibers connected to the routing module. The routing module therefore assigns the individual waveguides both between the modules of a subrack and between devices outside the subrack and modules of the subrack. In a simple embodiment, the assignment of the connections on the routing module is executed only using waveguides. In a further embodiment, the routing module can have splitters and/or combiners for splitting or combining optical signals. In a further refinement, the routing module can have active elements, such as for example optical amplifiers, for amplifying attenuated optical signals and/or for regenerating received signals or signals to be forwarded.

In a further refinement, the routing module has a central element for the subrack under consideration; a central element can be provided by a light source, such as for example a laser diode, which outputs clock signals, control information or cw (continuous wave) light, that is to say a continuous optical signal.

In a further refinement, the assignment of the connections on the routing module can be switched. Any optical switches, such as for example LCD (liquid crystal display) elements known per se or linear polymeric optical fibers, may be employed as switching elements. Particularly advantageous is the combination of a linear polymeric optical fiber with a thermal switch produced in the same material. The cooperation of the linear polymeric waveguide with the thermal switch accomplishes switchability of the assignment of the individual connections by means of electrical control signals fed to the routing module. An assignment by means of electrical control signals is also provided in the case of an electrically activated nonlinear polymeric optical fiber.

In the case of the subject matter of the application, it is possible for a plurality of optical signals of different wavelengths to be transmitted by wavelength division multiplexing on one waveguide of a bundle of optical fibers. For the purpose of separating or combining such signals, it is possible to use wavelength-selective elements, such as for example holograms, on a module or on the routing module.

For test purposes, instead of the routing module, it is possible to plug on an analysis module on which there is arranged an evaluation and display device, or which is connected to an evaluation and display device arranged outside the module frame. This measure accomplishes simplified fault tracing and hence shorter elimination of faults.

We claim:

1. A module subrack assembly comprising:
   a subrack accommodating at least one routing module having a plurality of input ports and at least one output port, the subrack further accommodating a plurality of modular components, each modular component being connected to the routing module by a linking optical fiber bundle comprising a multiple-plug connector at one end of the linking bundle that is connected to the modular component and a multiple-plug connector at the other end of the linking bundle that is connected to an input port of the routing module,
   the output port of the routing module accommodating a multiple-plug connector that is connected to one end of an output optical fiber bundle,
   each linking optical fiber bundle comprising a plurality of optical fibers, each output optical fiber bundle comprising a plurality of optical fibers, each optical fiber of each linking bundle is optically connected to an optical fiber of an output bundle by the routing module.

2. The subrack assembly of claim 1 wherein the multiple-plug connectors of the connecting optical fiber bundles detachably connects each said conventional modules to the routing module.

3. The subrack assembly of claim 1 wherein the multiple-plug connectors of the output optical fiber bundles is detachably connected to the routing module.

4. The subrack assembly of claim 1 wherein each conventional module comprises a socket for accommodating a multiple-plug connector.

5. The subrack assembly of claim 1 wherein each conventional module comprises a socket for accommodating a multiple-plug connector.

6. The subrack assembly of claim 1 wherein the routing module is disposed at a central installation position on the subrack.

7. The subrack assembly of claim 1 wherein the routing module comprises a plurality of output ports, each of said output ports a multiple-plug connector that is connected to one end of an output optical fiber bundle, the other end of which is connected to a device disposed remote from the subrack.

8. The subrack assembly of claim 1 wherein the multiple plug connectors that are connected to the conventional modules are also connected to the subrack.

9. The subrack assembly of claim 1 wherein the multiple plug connectors that are connected to the routing module are also connected to the subrack.

10. The subrack assembly of claim 1 wherein the routing module connects optical fibers of the linking bundle to optical fibers of the output bundle with optical fibers.

11. The subrack assembly of claim 1 wherein the routing module connects optical fibers of the linking bundle to optical fibers of the output bundle with combiners which combine optical signals.

12. The subrack assembly of claim 1 wherein the routing module connects optical fibers of the linking bundle to optical fibers of the output bundle with splitters which split optical signals.

13. The subrack assembly of claim 1 wherein the routing module connects optical fibers of the linking bundle to optical fibers of the output bundle with combination combiners/splitters which combine and/or split optical signals.

14. The subrack assembly of claim 1 wherein the routing module further comprises at least one switch for switching the connections between the optical fibers of the linking bundles and the optical fibers of the output bundle.

15. The subrack assembly of claim 1 wherein the routing module further comprises at least one switch for switching the connections between the optical fibers of the linking bundles and the optical fibers of the output bundle, the switch comprising a linear polymeric waveguide and a thermal switch, the linear polymeric waveguide cooperating with the thermal switch.

16. The subrack assembly of claim 1 wherein the routing module further comprises at least one switch for switching the connections between the optical fibers of the linking bundles and the optical fibers of the output bundle, the switch comprising a non-linear polymeric waveguide which can be activated by electrical signals.

17. The subrack assembly of claim 1 wherein the routing module further comprises a wavelength-selective element for separating or combine optical signals of different wavelengths.

18. The subrack assembly of claim 1 wherein the routing module further comprises means for the evaluation and display of errors.

19. A method of connecting a plurality of optical signals to an output optical fiber bundle, the method comprising the following steps:
   providing a subrack,
   attaching at least one routing module to the subrack, the routing module comprising a plurality of input ports and at least one output port, the input and output ports of the routing module accommodating multiple-plug connectors of optical fiber bundles, the routing module providing a connection between individual optical fibers connected at an input port to individual optical fibers connected at an output port,
   attaching at least one modular component to the subrack,
   connecting the modular component to the routing module by a linking optical fiber bundle comprising a multiple-plug connector at one end of the linking bundle that is connected to the modular component and a multiple-plug connector at the other end of the linking bundle that is connected to an input port of the routing module,
   connecting the output port of the routing module to one end of an output optical fiber bundle having a multiple-plug connector.

20. A module subrack assembly for connecting a plurality of optical fibers to one or more components disposed remote from the subrack, the module subrack assembly comprising:
   a subrack accommodating at least one routing module having a plurality of input ports and a plurality of output ports, the subrack further accommodating a plurality of modular components, each modular component being connected to the routing module by a linking optical fiber bundle comprising a multiple-plug connector at one end of the linking bundle that is connected to the modular component and a multiple-plug connector at the other end of the linking bundle that is connected to an input port of the routing module,
   each output port of the routing module accommodating a multiple-plug connector that is connected to one end of an output optical fiber bundle, the output bundles being connected to the components disposed remote from the module subrack assembly,
   each linking optical fiber bundle comprising a plurality of optical fibers, each output optical fiber bundle comprising a plurality of optical fibers, each optical fiber of each linking bundle is optically connected to an optical fiber of an output bundle by an optical fiber disposed within the routing module.

21. A module subrack assembly comprising:

a subrack accommodating at least one routing module having a plurality of input ports and at least one output port, the subrack further accommodating a plurality of modular components, each modular component being connected to the routing module by a linking optical fiber bundle, the output port of the routing module being connected to one end of an output optical fiber bundle, each linking bundle is optically connected to the output bundle by the routing module.

22. The subrack assembly of claim 21 wherein each linking optical fiber bundle comprises a connector at one end that is connected to the modular component and a connector at another end that is connected to an input port of the routing module.

23. The subrack assembly of claim 21 wherein each linking optical fiber bundle comprises a plurality of optical fibers, each output bundle comprising a plurality of optical fibers, each fiber of the output bundle being connected to at least one fiber of a linking bundle.

24. A method of connecting a plurality of optical signals to an output optical fiber bundle, the method comprising the following steps:

providing a subrack, attaching at least one routing module to the subrack, the routing module comprising a plurality of input ports and at least one output port, the routine module providing a connection between individual optical fibers connected at an input port to individual optical fibers connected at an output port, attaching at least one modular component to the subrack, connecting the modular component to the routing module by a linking optical fiber bundle comprising a connector at one end of the linking bundle that is connected to the modular component and a connector at the other end of the linking bundle that is connected to an input port of the routing module, connecting the output port of the routing module to one end of an output optical fiber bundle.

25. A module subrack assembly for connecting a plurality of optical fibers to one or more components disposed remote from the subrack, the module subrack assembly comprising:

a subrack accommodating at least one routing module having a plurality of input ports and a plurality of output ports, the subrack further accommodating a plurality of modular components, each modular component being connected to the routing module by a linking optical fiber bundle, each output port of the routing module being connected to one end of an output optical fiber bundle, the output bundles being connected to the components disposed remote from the module subrack assembly.

26. The subrack assembly of claim 25 wherein each linking optical fiber bundle comprising a plurality of optical fibers, each output optical fiber bundle comprising a plurality of optical fibers, each optical fiber of each linking bundle is optically connected to an optical fiber of an output bundle by an optical fiber disposed within the routing module.

* * * * *